(12) United States Patent
Hazen et al.

(10) Patent No.: US 10,252,504 B2
(45) Date of Patent: Apr. 9, 2019

(54) METHOD AND APPARATUS FOR TRANSFER LAMINATION

(71) Applicants: John Hazen, South Hadley, MA (US); Robert Hazen, Holyoke, MA (US); Larry Hoague, Feeding Hills, MA (US)

(72) Inventors: John Hazen, South Hadley, MA (US); Robert Hazen, Holyoke, MA (US); Larry Hoague, Feeding Hills, MA (US)

(73) Assignee: HAZEN PAPER COMPANY, Holyoke, MA (US)

( * ) Notice: Subject to any disclaimer, the term of this patent is extended or adjusted under 35 U.S.C. 154(b) by 0 days.

(21) Appl. No.: 15/205,293

(22) Filed: Jul. 8, 2016

(65) Prior Publication Data

US 2016/0332433 A1    Nov. 17, 2016

Related U.S. Application Data

(63) Continuation-in-part of application No. 13/582,196, filed on Nov. 7, 2012, now Pat. No. 9,938,111.

(51) Int. Cl.
*B44C 1/14* (2006.01)
*H05K 3/12* (2006.01)
(Continued)

(52) U.S. Cl.
CPC .......... *B32B 37/025* (2013.01); *H05K 3/12* (2013.01); *B32B 37/10* (2013.01);
(Continued)

(58) Field of Classification Search
CPC ...... B32B 2037/243; B32B 2038/0092; B32B 2307/75; B32B 2457/00; B32B 37/025; B32B 37/10; B32B 37/1284; B32B 38/06; B32B 38/10; H05K 3/12; B44C 1/145; B65H 2301/5111; B65H 2301/5114; B65H 2301/51145; B65H 2301/5143; B65H 2301/5162; B65H 2701/1243; B65H 39/16; B65H 41/00; Y10T 156/1041
(Continued)

(56) References Cited

U.S. PATENT DOCUMENTS 4,330,352 A * 5/1982 Grimes .................. B32B 15/08
156/235
RE39,044 E * 3/2006 Ross ........................ B41M 3/12
156/230

FOREIGN PATENT DOCUMENTS

EP          1096341 A2 *  5/2001
WO     WO2010/144147 A1 * 12/2010

OTHER PUBLICATIONS

Written Opinion of PCT/US11/00387.*

\* cited by examiner

*Primary Examiner* — Sonya M Sengupta
(74) *Attorney, Agent, or Firm* — Grogan, Tuccilo & Vanderleeden LLP

(57) ABSTRACT

A method for producing a smooth coating on a substrate includes applying a release coating to a first side of a film, applying an application layer to said first side of said film over said release coating, bonding said first side of said film to a first substrate, applying a printable coating to a second side of said film while said first side of said film is bonded to said first substrate, and removing said film from said first substrate leaving said application layer deposited on said first substrate and said printable coating on said second side of said film.

19 Claims, 4 Drawing Sheets

(51) Int. Cl.
*B32B 37/00* (2006.01)
*B32B 37/10* (2006.01)
*B32B 37/12* (2006.01)
*B32B 37/24* (2006.01)
*B32B 38/00* (2006.01)
*B32B 38/06* (2006.01)
*B32B 38/10* (2006.01)

(52) U.S. Cl.
CPC ........... *B32B 37/1284* (2013.01); *B32B 38/06* (2013.01); *B32B 38/10* (2013.01); *B32B 2037/243* (2013.01); *B32B 2038/0092* (2013.01); *B32B 2307/75* (2013.01); *B32B 2457/00* (2013.01); *B44C 1/145* (2013.01)

(58) Field of Classification Search
USPC .......................... 156/220, 247, 227, 387, 390
See application file for complete search history.

STEP 1 - Coat Film Break Away

STEP 2 - Metallize Coated Film

STEP 3 - Laminate (Transfer) Film to Paper Substrate

METHOD AND APPARATUS FOR TRANSFER LAMINATION

CROSS-REFERENCE TO RELATED APPLICATIONS

This application is a Continuation-in-Part of U.S. patent application Ser. No. 13/582,196, filed on Mar. 2, 2011, which claims the benefit of U.S. Provisional Application Ser. No. 61/309,477, filed on Mar. 2, 2010, and further relates to U.S. Provisional Application Ser. No. 61/186,531, filed on Jun. 12, 2009, and U.S. Provisional Application Ser. No. 61/239,540, filed on Sep. 3, 2009, all of which are incorporated by reference herein in their entireties.

FIELD OF THE INVENTION

The present invention relates generally to a method and apparatus for transfer lamination and more specifically to a method and apparatus in which a transfer film is coated for a subsequent use during a transfer lamination process.

BACKGROUND OF THE INVENTION

Transfer lamination is a process by which a layer of material is applied to a substrate. Generally, transfer lamination involves bonding a transfer film having an application layer, e.g., a metallized layer, to a paper substrate, stripping the film from the substrate leaving the application layer, and then applying a coating to the layer to facilitate printing. As will be appreciated, this process typically involves multiple, separate steps.

In particular, the transfer film is coated in an initial step with a breakaway layer that allows the film to be stripped from the substrate while leaving the application layer and the breakaway layer on the substrate. After the film is coated, the application layer is applied, e.g., the film is metallized. Once the film has been metallized, an adhesive is applied and the film is then bonded to the substrate and the film/substrate is cured typically in an oven. Once removed from the oven, the film is stripped away and the substrate is coated and placed again in the oven to complete the process.

A drawback to this method is that the breakaway layer is applied to the transfer film in a step separate from the transfer lamination process. As will be apparent, each manufacturing step has associated costs and it is generally desirable to reduce such costs through a simplified process with as few manufacturing steps as reasonably necessary.

Moreover, the film used in the transfer of the application layer is typically discarded, or reused only a limited number of times, after it is stripped from the substrate due to the costs of reuse/recycling.

Used transfer film also presents disposal and recycling problems as such films are generally manufactured from polyesters such as polyethylene terephthalate, ("PET"), which are not easily recycled/remanufactured. In particular, plastic films are difficult to remanufacture in that individual characteristics of potentially remanufactured products vary considerably. Likewise, the variety of extruded resins in such films pose significant recycling challenges.

These challenges are evidenced by the fact that presently only about 4.5% of all waste plastic film is recycled in the United States and plastic film makes up approximately 3.1% of all landfilled municipal solid waste. In view of the above, it is desirable to have a transfer film that can be used a large number of times.

Moreover, is also generally desirable to create two usable end products, e.g., the metallized paper substrate and the used film, during a single inline lamination process, regardless of the specific end use of the film. In particular, it is desirable for used film to have multiple potential uses including, for example, use of the film as box wrap, gift wrap and the like, in addition to reuse in a subsequent lamination process. As will be appreciated, this maximizes resources and provides significant manufacturing advantages. Such benefits are unattainable with known processes.

It is also desirable to coat a transfer film for a subsequent use in which the film is embossed or printed. This provides a great deal of flexibility in the end use of a used transfer film again maximizing resources and providing a significant environmental benefit.

As such, a need exists for a method and apparatus for transfer lamination which provides an ease of manufacture and cost savings currently unavailable with known processes. A need also exists for a transfer lamination process that does not require the disposal and/or recycling of a transfer film after a limited number of laminations. As discussed in detail herein, the present invention addresses these needs.

SUMMARY OF THE INVENTION

It is an object of the present invention to provide a method and apparatus for transfer lamination.

It is an additional object of the present invention to provide a method and apparatus for transfer lamination which provides an ease of manufacture and cost savings currently unavailable with known processes.

It is another object of the present invention to a provide method and apparatus for transfer lamination in which a transfer film need not be discarded or recycled after a single lamination.

It is an additional object of the present invention to provide a method and apparatus for transfer lamination which provides an ease of manufacture and cost savings through the inline coating of a transfer film for reuse while it is in use in a transfer lamination process.

It is another object of the present invention to provide a method and apparatus for transfer lamination in which a transfer film does not need to be discarded or recycled after a single lamination as it is coating for reuse during a transfer lamination process.

It is an object of the present invention to provide a method and apparatus for transfer lamination in which a breakaway layer may be easily applied to a transfer film.

It is yet another object of the present invention to provide a method and apparatus for transfer lamination in which a breakaway layer is easily applied to a transfer film through an inline process in which the film is bonded to a substrate prior to application of the breakaway layer.

It is an additional object of the present invention to provide a method and apparatus for transfer lamination in which a breakaway layer is applied to a transfer film through an inline process in which the film is bonded to a substrate prior to application of the breakaway layer resulting in a breakaway layer superior to that produced through known offline processes.

It is another object of the present invention to provide a method and apparatus for transfer lamination that provides a significant environmental benefit not available with known processes.

It is an additional object of the present invention to provide a method and apparatus for transfer lamination that provides a significant environmental benefit by facilitating multiple potential reuses of a used transfer film.

It is yet another object of the present invention to provide a method and apparatus for transfer lamination in which a transfer film can be coated for multiple reuses.

It is an additional object of the present invention to provide a method and apparatus for transfer lamination in which a transfer film can be coated for subsequent use as box wrap.

It is yet another object of the present invention to provide a method and apparatus for transfer lamination in which multiple coatings are applied to a transfer film inline during a transfer lamination process.

An embodiment of the inventive method for producing a smooth coating on a substrate includes applying a release coating to a first side of a film, applying an application layer to the first side of the film over the release coating, bonding the first side of the film to a first substrate, applying a printable coating to a second side of the film while the first side of the film is bonded to the first substrate, and removing the film from the first substrate leaving the application layer deposited on the first substrate and the printable coating on the second side of the film.

In another embodiment, a method for preparing a substrate for electronic printing involves applying a release coating to a first side of a film, applying an application layer to the first side of the film over the release coating, bonding the first side of the film to a first substrate, applying a printable coating to a second side of the film while the first side of the film is bonded to the first substrate, curing the film and the substrate in an oven while the film is bonded to the first substrate and after the second coating is applied to the second side of the film, and removing the film from the substrate leaving the metallized layer deposited on the first substrate and the second coating on the second side of the film. The application of the printable coating is performed as an inline part of a transfer lamination process.

In yet another embodiment, a system for transfer lamination of a substrate includes a bonding station for bonding a metallized first side of a film to a first substrate, a first coating station for applying a printable coating to a second side of the film while the film is bonded to the first substrate, a curing station for curing the bonding film and first substrate, and a stripping station for removing the film having the coating on the second side of the film from the first substrate.

These and other objects, features and advantages of the present invention will become apparent in light of the detailed description of the best mode embodiment thereof, as illustrated in the accompanying drawings.

DETAILED DESCRIPTION OF THE PREFERRED EMBODIMENT

Figure 1:
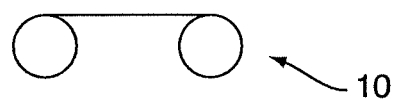
FIG. 1 is a graphical illustration of a prior art transfer lamination process in which a transfer film is first coated and metallized and then used in a lamination process.
Figure 1:
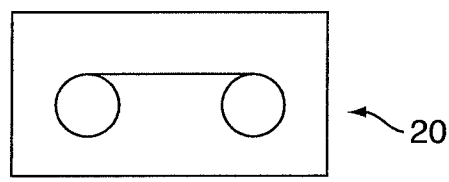
Figure 1:
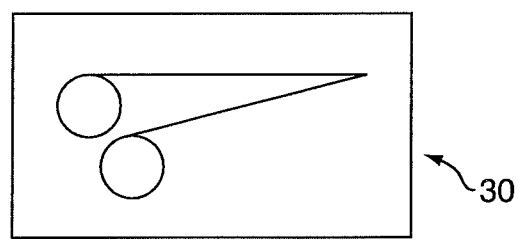

Referring to FIG. 1, known processes for transfer lamination involve three general steps. The first of these steps, labeled with reference number 10, is to coat the film used in the lamination. In particular, the film is coated with a breakaway layer that allows it to be removed or stripped from the substrate after the lamination has occurred. This step is performed offline, that is, it is not part of the main transfer lamination process that results in the end product. Moreover, only one side of the film is coated in this initial step.

After a side of the film has been coated with the breakaway layer, typically a polymer such as an acrylate or urethane, the film is metallized. The metallization step is also offline from the transfer lamination process and involves placing the coated film in a relatively large metallizer where metals are vacuum deposited on the coated film.

Once the coated film has been metallized, it is bonded to a substrate in a third step, represented by reference number 30. In this step, the coated and metallized film is placed within a transfer lamination apparatus and the film is bonded via pressurized bonding with an adhesive to the substrate. Once bonded, the film/substrate typically are cured typically in an oven. The film is then stripped away from the substrate when it emerges from the oven leaving the metal and breakaway layer on the substrate. The metallized substrate may then be coated and cured again in the oven resulting in the end product.

As stated, the above-recited steps of coating the film with a breakaway layer, metallizing the coated film and then using the metallized, coated film in a transfer lamination process, are separate from one another. As will be readily appreciated, the greater number of steps in the manufacture of a product, the higher the associated manufacturing costs and degree of manufacturing difficulty.

Figure 2:
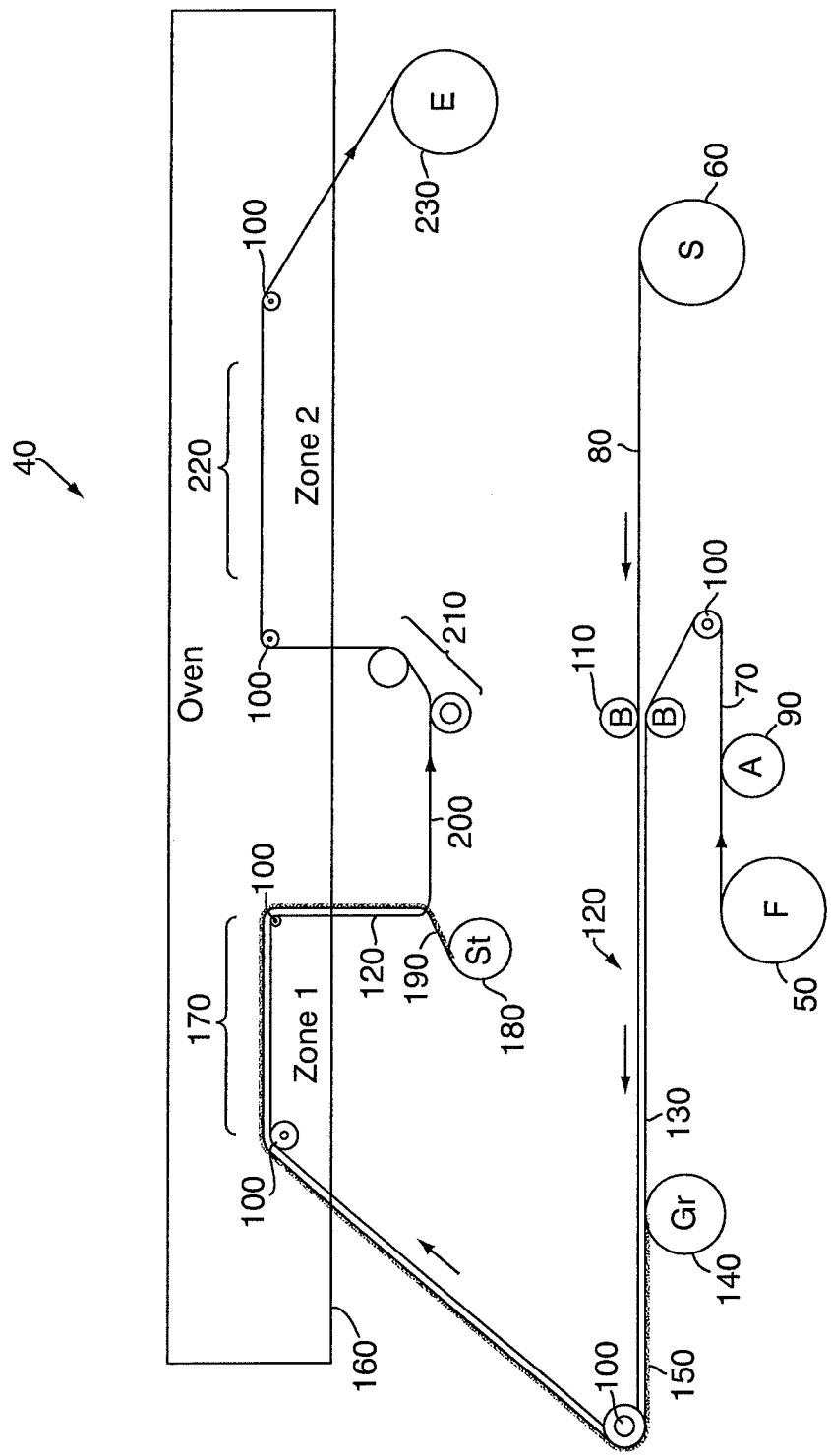
FIG. 2 is a simplified schematic diagram of an apparatus for transfer lamination in accordance with an embodiment of the present invention.

Turning now to FIG. 2, the inventive apparatus 40 combines the steps of applying the breakaway coating to a transfer film and using the coated film in a lamination process to provide an ease of manufacture and cost reduction heretofore unknown in the art. This is accomplished through the depicted apparatus 40 which includes a transfer film roll 50 and a substrate roll 60 which are unwound via motors in directions A and B respectively. The transfer film 70 is unwound from the transfer film roll 50 simultaneously with substrate 80 as it is unwound from the substrate roll 60.

The transfer film 70 has been coated with a breakaway layer on a first side which is to be bonded to the substrate 80. The film 70 has also been previously metallized in a separate process. For the present discussion, the film is described as being new, i.e., no side has been previously coated with a breakaway layer. Alternatively, however, the breakaway later present on the first side could also be the result of the inventive process, that is, the film may have been previously used and inline coated as described herein.

As the substrate 80 is unwound and travels in direction A, an adhesive/glue is applied by an applicator 90. The adhesive allows the film 70 and substrate 80 to be securely bonded. After the application of the adhesive, the film 70 encounters an idler roller 100, which changes the path of the film and guides it toward a bonding station.

In particular, the film 70 and substrate 80 are bonded through pressure bonding which is accomplished by rollers 110. Although rollers are depicted, it will be apparent that other means of bonding whether pressurized or not may be employed including the use of a pressurizing chamber instead of rollers.

Once the transfer film 70 has been bonded to the substrate 80, a first intermediate product 120 is formed. This intermediate product 120 includes the transfer film 70 with the substrate 80 bonded to the first side of the film 70. A second opposite side of the transfer film 130 remains uncoated.

As shown, this second, uncoated side 130 is then passed through a gravure coating station 140. At the gravure station 140 a roller running in a coating bath (not shown) effectively deposits a coating onto the uncoated side 130 as it passes between the coating roller and a pressure roller (not shown). The gravure coating station 140 applies a breakaway layer 150 to the uncoated side 130 eliminating the need to coat the side 130 in a separate step prior to reuse in the present lamination process.

The inline coating of the uncoated side 130 of the film 70 is an important aspect of the present invention. By providing a breakaway layer 150 to the transfer film 70 during the lamination process, a normally separate manufacturing step is avoided facilitating the convenient, cost-effective reuse of the film 70. This simplified, streamlined process provides a cost savings and ease of manufacture that is presently unknown in the art.

Moreover, it has been found that the inline coating of intermediate product 120, i.e., the film 70 bonded to the substrate 80 is superior to offline coating. In particular, it is easier to apply a breakaway layer 150 to a film 70 that is supported by a relatively rigid substrate 80 than it is to coat an unbonded flexible film. Applying a breakaway layer to the bonded intermediate product 120 results in a potentially more uniform layer as well due to this enhanced rigidity.

The simplified, cost effective manufacturing process increases the probability that the film 70 will be reused multiple times as the inline application of the breakaway layer is convenient and results in a potentially better, more uniform layer to be metallized.

While the present invention contemplates use of a gravure process, it will be appreciated that other coating methods for the inline application of the breakaway layer may be employed. Such methods may include reverse roll coating and the like as long as they can effectively apply the breakaway layer.

Moreover, the gravure coating station 140 can be used to apply other types of coatings depending upon the desired end use of the film. That is, the inventive process can be used to create films for end uses other than reuse in a subsequent lamination process.

In particular, instead of applying a breakaway layer 150, the gravure station can be configured to apply a coating having a specific color. For example, a permanent, solid white coating can be applied to the film facilitating its use for decorative purposes such as box wrap. As will be readily appreciated, coatings having colors other than white may be applied depending on the desired colorway or design.

It is also envisioned, that printable coatings can be applied to the film such that it can be used in a subsequent printing process. Indeed, the chemistry of such coatings may be varied depending on the type of printing to be carried out on the film. These print processes may include flexo or roto gravure, Indigo® and laser printing.

The ability to coat a transfer film for uses other than reuse in a subsequent lamination process is an important aspect of the present invention. As will be appreciated, this provides flexibility, maximizes resources and provides significant manufacturing advantages. A significant environmental benefit is also achieved through the inventive process and apparatus.

Returning now to FIG. 2, once past the gravure station 140, the now breakaway-coated intermediate product 120 encounters an idler roller 100, which directs the product 130 toward the oven 160. The intermediate product 130 enters a first zone 170 of the oven 160 where it is cured at a preselected temperature for a specific time period. The product 120 is then directed toward a stripping station 180 where the now pre-coated transfer film 190 is removed from the substrate leaving a substrate that includes the film's breakaway layer and metal layer bonded to its surface. This second intermediate product 200 is then directed toward a coating station 210 where it is coated to facilitate printing.

Once this coating has been applied, the second intermediate product 200 is directed toward the oven 160 where it is placed in a second zone to further cure. The result of this second curing process is the end product 230, which is collected on a roll 230.

Figure 3:
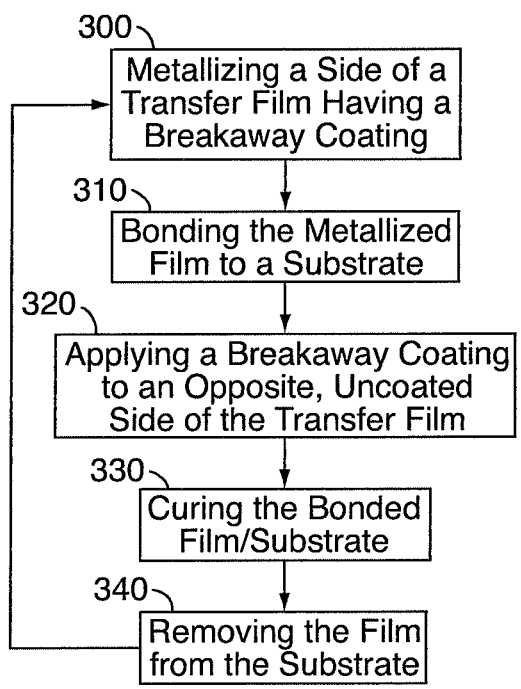
FIG. 3 is a flowchart illustrating a method for transfer lamination in accordance with an embodiment of the present invention.

Turning now to FIG. 3, the inventive process includes several key steps. The first of these steps is to metallize a first side of a transfer film, as indicated by reference number 300. As discussed above, prior to metallization, the film has been coated with a breakaway layer. In the ensuing discussion, it is contemplated that the film to be metallized has been pre-coated with the breakaway layer as part of the inventive process. In other words, the film has been previously used and precoated in an earlier transfer lamination process. As will be appreciated, if the film is new and unused a first offline breakaway coating will be necessary.

The metallized film is then bonded to a substrate, generally paper, in a second step 310. Importantly, a breakaway layer is then applied to a second side of the transfer film at step 320 so that, as discussed above, the film may be easily and inexpensively reused.

The bonded film/substrate is then cured at step 330. This process is generally accomplished through the use of a multi-zone oven.

Once the film/substrate has been cured, the film is removed from the substrate at step 340. At this point, the substrate is coated with the breakaway layer and the metal layer. The film with its pre-coated side, can then be reused beginning with metallization step 300. Optionally, the substrate may be coated for printing in an additional, subsequent step and then cured again in the oven.

Moreover, it may also be possible to reuse the previously used side of the film. That is, one could strip the remaining material off the used side and recoat it with a breakaway layer. Alternatively, one could simply apply a breakaway layer over any residual material on the previously used side.

Figure 4:
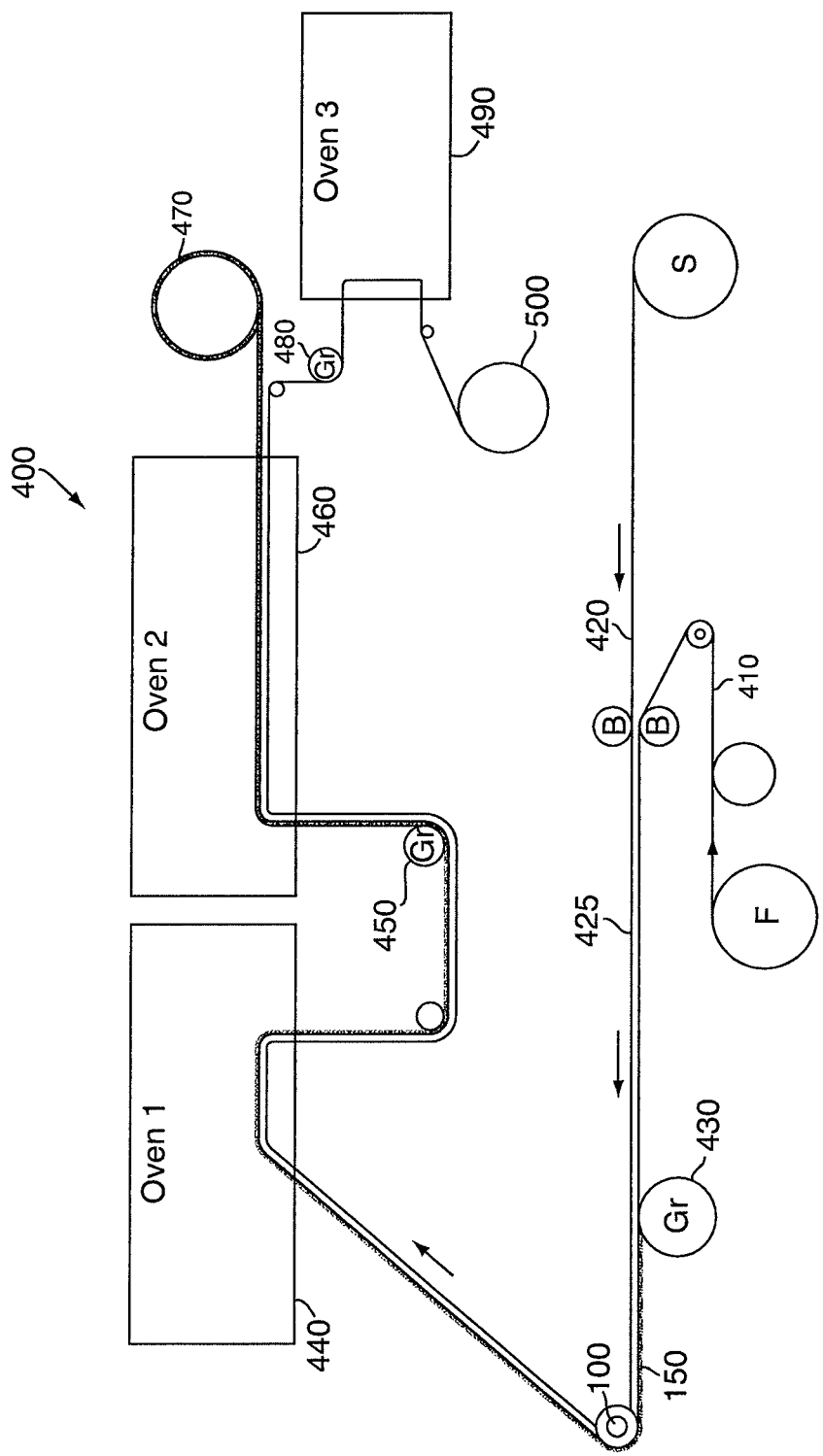
FIG. 4 is a simplified schematic diagram of an apparatus for transfer lamination in accordance with an alternative embodiment of the present invention.

Turning now to FIG. 4, an alternative embodiment of the present apparatus 400 is depicted. This embodiment, while similar to that depicted in FIG. 2, includes multiple gravure stations and ovens and facilitates the application of multiple coatings on a transfer film.

In this embodiment, the film 410 is adhered to the substrate 420 in a process much like that described above in connection with the embodiment shown in FIG. 2. The film/substrate intermediate product 425 then passes by a first gravure station 430 in which a coating is applied to the film side of the intermediate product 425. The film/substrate then passes through a first oven 440 to cure.

After emerging from the first oven 440, the film side of the intermediate product is coated again at a second gravure station 450. The film/substrate is then passed through a second oven 460.

The second oven 460 and second gravure station 450 are an important aspect of the present invention as they allow multiple coatings to be placed on the transfer film. This, in turn, allows for a wide range of potential end uses of the film. For example, the film could be coated with a break-away coating at the first gravure station and then an embossable coating may be applied at the second gravure station 450, thereby creating an embossable transfer film which could be embossed with a holographic design prior to metallization.

Referring back to FIG. 4, after the film/substrate emerges from the second oven 460, the transfer film, now with two coatings, is stripped and would about spool 470. The metallized substrate then passes through a third gravure station 480 where it receives a coating that facilitates printing on the metallized surface and into a third oven 490 for a final cure. The metallized substrate is the wound about spool 500.

In the present example, the end products are a metallized substrate which is ready for printing and a transfer film that has two coatings on it and may be used for a variety of purposes depending on the coatings.

In addition to the above, it is also possible to provide one of the gravure stations with a printing head so that the film may be printed on during the transfer lamination process. For example, the second gravure station 450 could be equipped with a printing head so that it can print on the transfer film after it has received a color coating at the first gravure station 430. In this configuration, the second gravure station 450 can be used to print a corporate logo or other decorative design on a colored film.

Although the embodiment in FIG. 4 is depicted with three gravure stations and ovens, other configurations are possible in which more than three stations/ovens are employed depending on the desired characteristics of the end product created from the transfer film.

In sum, the present invention is a method and apparatus for transfer lamination which, through the inline coating of a transfer film, provides an ease of manufacture, flexibility and cost savings currently unavailable with known processes. The inventive method and apparatus also does not necessitate the disposal and/or recycling of a transfer film after a limited number of uses and provides an easily applied and potentially superior breakaway coating.

As indicated above, in addition to, or alternative to applying a breakaway coating to the second side of a transfer film after it has been bonded to a substrate, other coatings may be applied to the exposed second side surface of the film after it has been bonded to the substrate to render the film, once stripped from the substrate as the final step in a transfer lamination process, suitable for various other end uses. For example, in an embodiment, a printable or print-receptive coating may be applied to the exposed, second side surface of the film at a gravure station or other inline coating station while the film is bonded to the substrate, and then cured in an oven, prior to stripping the film, in order to advantageously render the coating ultra-smooth for subsequent use in printing and electronic applications. As used herein, printable coating means a coating configured to receive any type of printing known in the art, including, but not limited to, digital, inkjet, gravure, offset, or other printing. Moreover, the printing may be a metal or dielectric (e.g., conductive and non-conductive pathways), as discussed in detail hereinafter. In an embodiment, the printable coating may be one of a clay coating, acrylic coating, nitrocellulose (nitro) coating, polyvinyl coating, urethane coating and/or PET base solution coating.

After the coating is applied to the second side surface of the film and cured, and once the film is stripped from the substrate as a final step in the transfer lamination process, thereby depositing the metallized layer from the first side of the film on the substrate, the second side surface of the film with the printable coating may then be laminated to a paperboard or other substrate to transfer the smooth, printable coating to such substrate.

Importantly, application of the printable coating to the film, as an inline part of the transfer lamination process, while the first side of the film is adhered to and supported by the relatively rigid substrate, provides for improved control of the film coating process. Moreover, application of the coating to the smooth, non-porous film produces an ultra-smooth and/or high gloss printable coating that can then be transferred to almost any substrate once the film is stripped from the substrate used in the transfer lamination process, including topographically rough substrates. Indeed, by applying the coating to the second side of the film while the film is supported by the transfer lamination substrate, film elongation due to high heat (such as during oven curing), chain welts, curls, cockles, wrinkles, worming, and bagginess can be reduced or eliminated, thereby achieving a much smoother and glossier coating than has heretofore been possible. As indicated above, this smooth, printable coating may then be easily transferred to another substrate for use in high resolution printing applications.

In particular, the method of the present invention therefore facilitates the application of ultra-smooth, high gloss, printable coatings to almost any substrate, regardless of its surface roughness. This is in stark contrast to existing cast coating methods, which are limited in the substrates on which smooth, printable coatings may be achieved. In particular, known cast coating methods are not suitable for rough substrates, as a smooth, high gloss finish is difficult to produce. It has been discovered, however, that coating the second side surface of a transfer film with a printable coating, as an inline part of a transfer lamination process, while the first side surface is bonded to a substrate, produces a very smooth, high gloss, printable coating on the film that can then be transferred to almost any substrate, regardless of its surface topography.

In an embodiment, it is contemplated that various dyes or pigments may be added to the coating prior to applying the coating to the second side of the transfer film, in order to achieve a smooth, high-gloss, printable coating of almost any desired color. Moreover, the opacity of the coating can be adjusted in process, which may be desirable where the coating and film are intended to be used as a final, integrated product such as for window signs, posters, packaging and the like (rather than the film being merely used as a coating carrier and transfer medium).

Importantly, the method of the present invention eliminates the use of latex, aluminum, aluminum salts, zinc, zinc sulfates aluminum sulfates, magnesium sulfates and other carboxal groups which are often necessary to achieve smooth coatings utilizing cast coating methods. In particular, rather than using these additives, the smooth texture of the printable coating is achieved by applying the generally additive-free coating to the smooth, second side surface of the transfer film while it is bonded to the transfer lamination substrate, stripping the film with the smooth, printable coating from the transfer lamination substrate, and then transferring the smooth, printable coating from the second side of the film to another substrate. After applying the smooth, printable coating to a paperboard or other substrate, digital, inkjet, gravure, offset, or other printing may be applied atop the coating.

It is further envisioned that electronic circuits and/or dielectric coatings (e.g., conductive and non-conductive pathways) may also be printed or otherwise applied to the substrate atop the smooth, printable coating once the coating is transferred from the second side of the film to the substrate, by any means known in the art. In contrast to conventional printing for optical viewing purposes, printed electronics require much more precision and a much smoother substrate surface. In particular, higher resolution and smaller structures are necessary in printed electronics, because they directly affect circuit density and functionality (especially transistors). A similar requirement holds for the precision with which the layers are printed on top of one another (layer to layer registration).

As discussed above, the present invention facilitates the application of an ultra-smooth, printable coating for electronic printing and the like, on almost any substrate, regardless of substrate surface roughness. This has heretofore not been possible with existing methods. This allows for a wider array of substrates to be used in printed electronics and other high resolution printing.

While the present application has heretofore been described in connection with the application of smooth printable coatings to paperboard substrates using a transfer film from a transfer lamination process, it is contemplated that the smooth, printable coating may be applied to any substrate such as, for example, flexible substrates including paper, foil, and polyethylene terephthalate (PET). This allows flexible circuits and the like to be produced for use in, for example, radio-frequency identification (RFID) tags, monitoring, data storage, display and visual effects, toys and other applications. In particular, the smooth coating method of the present invention, and subsequent printing of electronic circuits, can be utilized to produce near field communication (NFC) antennas (including Horn or diapole antennas), NFC printed tags, labels and other printed circuitry, NDEF (NFC data exchange format) circuits, UHF (RFID tags and labels; ultra-high frequency) and SHF (super-high frequency tags and labels). In an embodiment, the method of the present invention may also be used to adjust the specular glass for use in photosensitive receptors.

In an embodiment, a release coating may first be applied to the second side surface of the film prior to applying the printable coating, so that the coating can subsequently be transferred from the second side surface of the film to another substrate, as discussed above. Alternatively, in some embodiments, after the first side of the film is bonded to the substrate, a surface treatment may be applied to the second side of the film in order to facilitate adhesion of the second coating to the second side surface of the film. In certain embodiments, the surface treatment may include corona or plasma treatment of the second side surface to obtain better adherence of solvent and water-based coatings to the film.

As indicated above, in various embodiments, the coatings may either be utilized in connection with a release layer that is first applied, so that the coatings may be transferred from the film to another substrate, or permanently applied to the film where the film and coating are intended to be utilized as a unitary material in various downstream applications, such as in product packaging, advertising materials and the like.

Although this invention has been shown and described with respect to the detailed embodiments thereof, it will be understood by those of skill in the art that various changes may be made and equivalents may be substituted for elements thereof without departing from the scope of the invention. In addition, modifications may be made to adapt a particular situation or material to the teachings of the invention without departing from the essential scope thereof.

Therefore, it is intended that the invention not be limited to the particular embodiments disclosed in the above detailed description, but that the invention will include all embodiments falling within the scope of this disclosure.

What is claimed is:

1. A method for producing a smooth coating on a substrate, said method comprising the steps of:
    applying a release coating to a first side of a film;
    applying an application layer to said first side of said film over said release coating;
    bonding said first side of said film to a first substrate;
    applying a printable coating to a second side of said film while said first side of said film is bonded to said first substrate such that said first substrate imparts rigidity to said film while said printable coating is applied to said second side of said film; and
    removing said film from said first substrate leaving said application layer deposited on said first substrate and said printable coating on said second side of said film.

2. The method according to claim 1, further comprising the step of:
    transferring said printable coating from said second side of said film to a second substrate.

3. A method for producing a smooth coating on a substrate, said method comprising the steps of:
    applying a release coating to a first side of a film;
    applying an application layer to said first side of said film over said release coating;
    bonding said first side of said film to a first substrate;
    applying a printable coating to a second side of said film while said first side of said film is bonded to said first substrate;
    curing said printable coating in an oven while said film is bonded to said first substrate;
    removing said film from said first substrate leaving said application layer deposited on said first substrate and said printable coating on said second side of said film; and
    transferring said printable coating from said second side of said film to a second substrate.

4. The method according to claim 3, wherein:
    said application layer is a metallized layer.

5. The method according to claim 4, wherein:
    said printable coating is one of a clay coating, acrylic coating, nitrocellulose coating, polyvinyl coating, urethane coating or PET base solution coating.

6. The method according to claim 5, wherein:
    said second substrate is one of a paperboard, foil or PET substrate.

7. The method according to claim 5, wherein:
    said printable coating includes one of a dye and a pigment.

8. The method according to claim 5, further comprising the step of:
    printing an electronic circuit on said printable coating after said printable coating is transferred to said second substrate.

9. The method according to claim 8, further comprising the step of:
    prior to applying said printable coating to said second side of said film, applying a second release coating to said second side of said film.

10. The method according to claim 5, wherein:
application of said printable coating to said second side of said film is performed as an inline part of a transfer lamination process.

11. A method for preparing a substrate for electronic printing, said method comprising the steps of:
applying a release coating to a first side of a film;
applying an application layer to said first side of said film over said release coating;
bonding said first side of said film to a first substrate;
applying a printable coating to a second side of said film while said first side of said film is bonded to said first substrate;
curing said film and said substrate in an oven while said film is bonded to said first substrate and after said second coating is applied to said second side of said film; and
removing said film from said substrate leaving said application layer deposited on said first substrate and said second coating on said second side of said film;
wherein said application of said printable coating is performed as an inline part of a transfer lamination process.

12. The method according to claim 11, further comprising the step of:
transferring said printable coating from said second side of said film to a second substrate.

13. The method according to claim 12, wherein:
said application layer is a metallized layer.

14. The method according to claim 13, wherein:
said printable coating is one of a clay coating, acrylic coating, nitrocellulose coating, polyvinyl coating, urethane coating or PET base solution coating.

15. The method according to claim 14, wherein:
said second substrate is one of a paperboard, foil or PET substrate.

16. The method according to claim 14, wherein:
said printable coating includes one of a dye and a pigment.

17. The method according to claim 12, further comprising the step of:
applying at least one conductive pathway on said printable coating after said printable coating is transferred to said second substrate.

18. The method according to claim 17, wherein:
the step of applying said at least one conductive pathway on said printable coating includes printing said at least one conductive pathway.

19. The method according to claim 18, further comprising the step of:
prior to applying said printable coating to said second side of said film, applying a second release coating to said second side of said film.

* * * * *